(12) United States Patent
Hsu et al.

(10) Patent No.: US 7,268,560 B2
(45) Date of Patent: Sep. 11, 2007

(54) WIDEBAND DEVICE MODELING METHOD

(75) Inventors: Yung-Jane Hsu, Hsinchu (TW); Ming-Hsiang Chiou, Hsinchu (TW)

(73) Assignee: Frontend Analog and Digital Technology Corporation, Taipei (TW)

( * ) Notice: Subject to any disclaimer, the term of this patent is extended or adjusted under 35 U.S.C. 154(b) by 648 days.

(21) Appl. No.: 10/736,576

(22) Filed: Dec. 17, 2003

(65) Prior Publication Data

US 2005/0137811 A1   Jun. 23, 2005

(51) Int. Cl.
*G01R 31/11* (2006.01)
(52) U.S. Cl. ...................... 324/534; 324/76.11; 702/57
(58) Field of Classification Search ................ 324/534
See application file for complete search history.

(56) References Cited

U.S. PATENT DOCUMENTS 6,775,901 B1 *  8/2004 Lee et al. ................. 29/602.1

2004/0064296 A1 *  4/2004 Saxena et al. ................. 703/2

* cited by examiner

*Primary Examiner*—Vincent Q. Nguyen
(74) *Attorney, Agent, or Firm*—Lowe Hauptman & Berner, LLP

(57) ABSTRACT

A wideband device modeling method comprises using ultra-short time-domain impulse responses measurement and using a subsequent extraction of said ultra-short time-domain impulse responses measurement. The wideband device modeling method in the invention is to provide a model that could faithfully describe an ultra-short TD response and would conform to the wideband consideration. An ultra-short impulse with tens of pico-second width has been used in this work for characterizing the TD responses of the devices. Moreover, the wideband device modeling method in the invention is to provide a layer peeling technique, widely used in characterizing PCB interconnection or package, is mixed with a conventional spiral inductor physical model. The wideband device modeling method in the invention also provides an extension equivalent circuit combined with the BSIM3v3 model.

3 Claims, 6 Drawing Sheets

WIDEBAND DEVICE MODELING METHOD

BACKGROUND OF THE INVENTION

1. Field of the Invention

The invention relates to an easy-to-use, accurate wideband IC device modeling method that will be beneficial to enhancing the design reliability of high-speed IC's and switching-type high-frequency IC's. The method is based on time-domain ultra short impulse responses measurement and subsequent model elements extraction.

2. Description of the Prior Art

To accurately simulate the performance of high-speed IC's and switching-type high-frequency IC's, accurate wideband device models for both passive and active semiconductor devices are essential, especially when the data rate enters into >Gbps range for high-speed IC's or when the (large-signal) oscillation frequency is of GHz and above. For active devices, however, current commonly used device models such as BSIM3V3 models do not properly cover the high-frequency behavior of devices. Conventional extension models based on the BSIM3V3 models and frequency-domain S-parameter fittings can only cover up to some GHz bandwidth, and the accuracy has been poor. It is not easy to establish good wideband (tens or even hundreds of GHz) device models by frequency-domain characterizations and corresponding fittings. Proper proposition of equivalent circuit models is critical in achieving a good fit to the measured S parameters. In fact, it is very difficult to fit all the S parameters in a wide frequency range. Therefore, the narrow-band models thus generated and their fitted "wideband" models cannot correctly describe the nonlinear and frequency-dependent characteristics of the devices. (These characteristics are essential to the ultra-short time-domain (TD) responses of the devices and are important for designing high-speed circuits.) That is, these models are not very suitable for the use in switching type circuits where wideband signals are present.

The inventor has notice the various disadvantages associated with the conventional wideband device models and thought to improve it, and after having carried out an intensive study for many years, has successfully developed a wideband device modeling method of the invention.

SUMMARY OF THE INVENTION

An object of the invention is to provide a modeling method that could faithfully describe the ultra-short TD response of devices and would therefore conform to the wideband consideration. An ultra-short impulse with a width of tens pico-second has been used in this method for characterizing the TD responses of the devices.

Another object of the invention is to provide wideband equivalent circuit models for spiral inductors by combining a layer peeling technique (LPT) that has been widely used in characterizing PCB interconnection or package.

Another object of the invention is to provide a wideband extension equivalent circuit model for MOSFET that is combined with conventional low frequency BSIM3v3 model.

BRIEF DESCRIPTION OF THE DRAWINGS

The drawings disclose an illustrative embodiment of the present inventions which serves to exemplify the various advantages and objects hereof, and are as follows.

DETAILED DESCRIPTION OF THE PREFERRED EMBODIMENT

Figure 1:
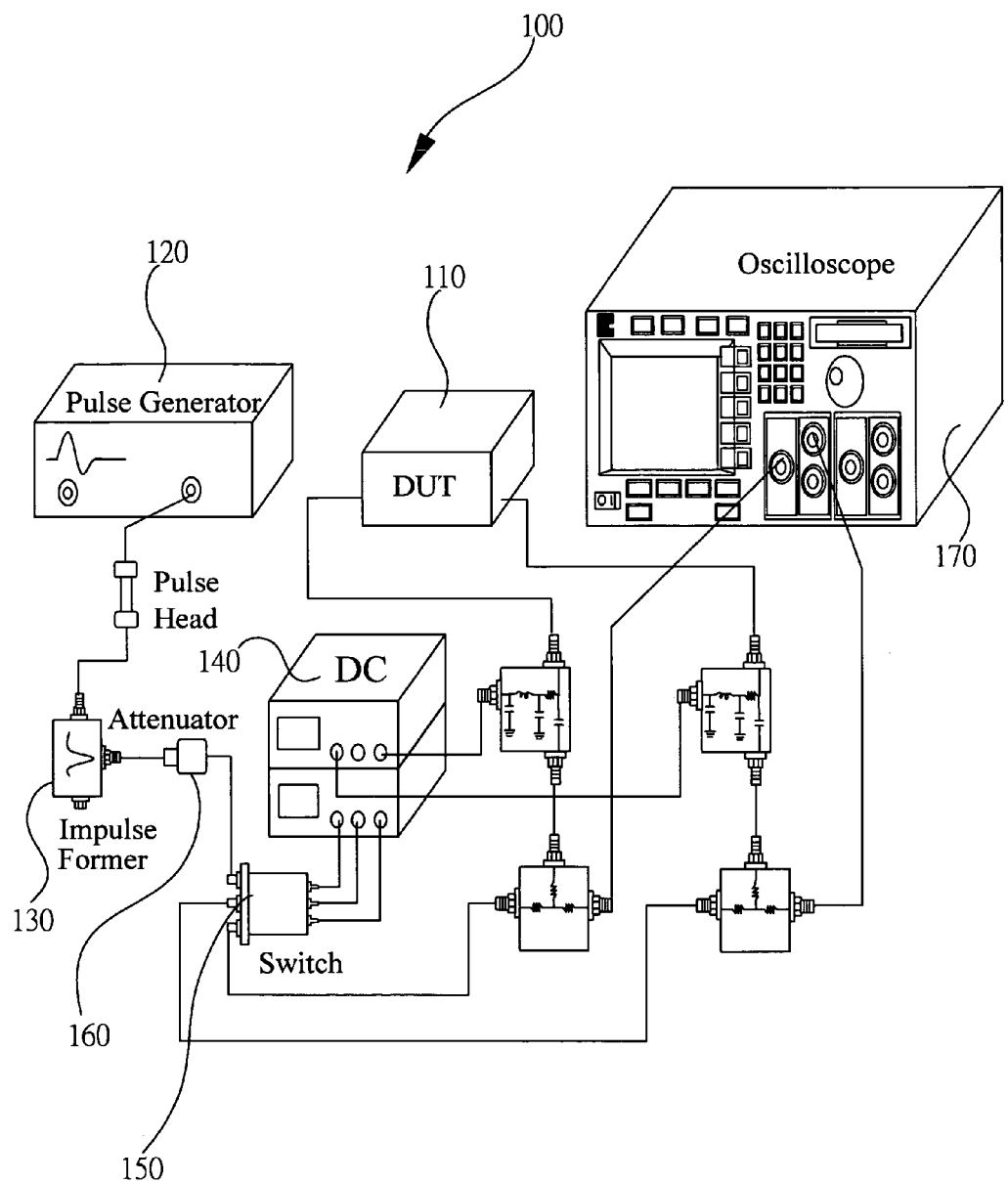
FIG. 1 is a schematic view of an embodiment of the time-domain measurement system according to the invention.

Referring to FIG. 1, it shows time-domain measurement system 100 used in the present invention. By measuring reflection and transmission signals after an ultra-short impulse is applied to the device 110, important modeling information about the device 110 can be extracted by proper signal processing. This time-domain measurement system 100 applies an impulse with short duration to a device 110 for measuring its corresponding responses. In order to observe the ultra-short time responses of the device 110, the time scale of such measurement is at ps. In this measurement system 100, a pulse generator 120 is selected to provide a −9 volts pulse with a fall time of only 15 ps. In addition, with an impulse forming network 130 being attached, a −3 volt, 30 ps wide impulse can be generated. The separation of incident and reflected/transmitted signals is achieved by the use of power supply 140. A switch 150 is used for selecting the signal path between port 1 and port 2. In addition, the switch 150 could attach an attenuator 160 to control the amplitude of the impulse. Finally, a high-bandwidth oscilloscope 170 records these signals.

Figure 2:
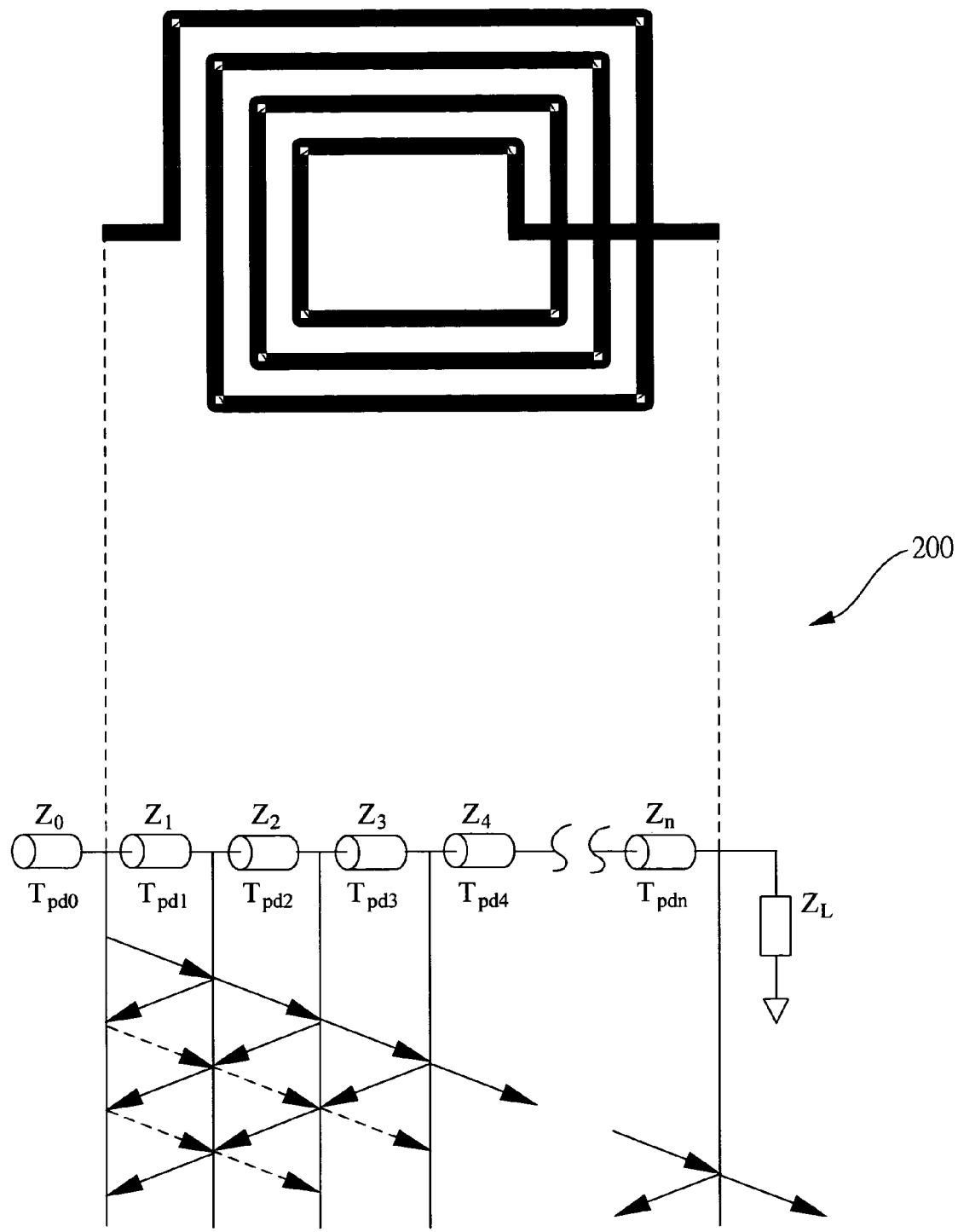
FIG. 2 is a signal flow chart for LPT according to the invention.

Referring to FIG. 2, it is a signal flow chart for layer peeling technique (LPT) 200 according to the invention. The wideband modeling technique for spiral inductors in the invention adopts an ultra-short impulse signal to apply to the device. Usually, the spiral inductor is a transmission-line-like structure with bends. In fact, as the length or turns of the spiral inductor increases, the wave phenomena would be much apparent. That is, the time resolution of the measurement technique has to be high to record the responses from the discontinuities within the spiral inductor. Thus, the measurement results cover a wide frequency range. Conventionally, a layer peeling technique (LPT) 200 is well known in time-domain reflectometry measurements to characterize a non-uniform transmission line through determining the corresponding impedance value and the section number of the ideal transmission lines in the model. This invention uses a simplified LPT 200 for the spiral inductors. The signal flows in the spiral inductor have been analyzed by using LPT 200, as shown in FIG. 2. In fact, the spiral inductor is not a highly non-uniformed structure. Therefore, as the LPT is applied to the spiral inductor, the responses of the device can be simplified by including only the first forward and backward signal paths. The reflection coeffi cient ρij that is due to Zi and Zj discontinuity can be calculated by $$\rho ij = \frac{Zj - Zi}{Zi + Zj} \quad (1)$$

which leads to $$Zj = \frac{1 + \rho ij}{1 - \rho ij} \times Zi \quad (2)$$

Figure 3:
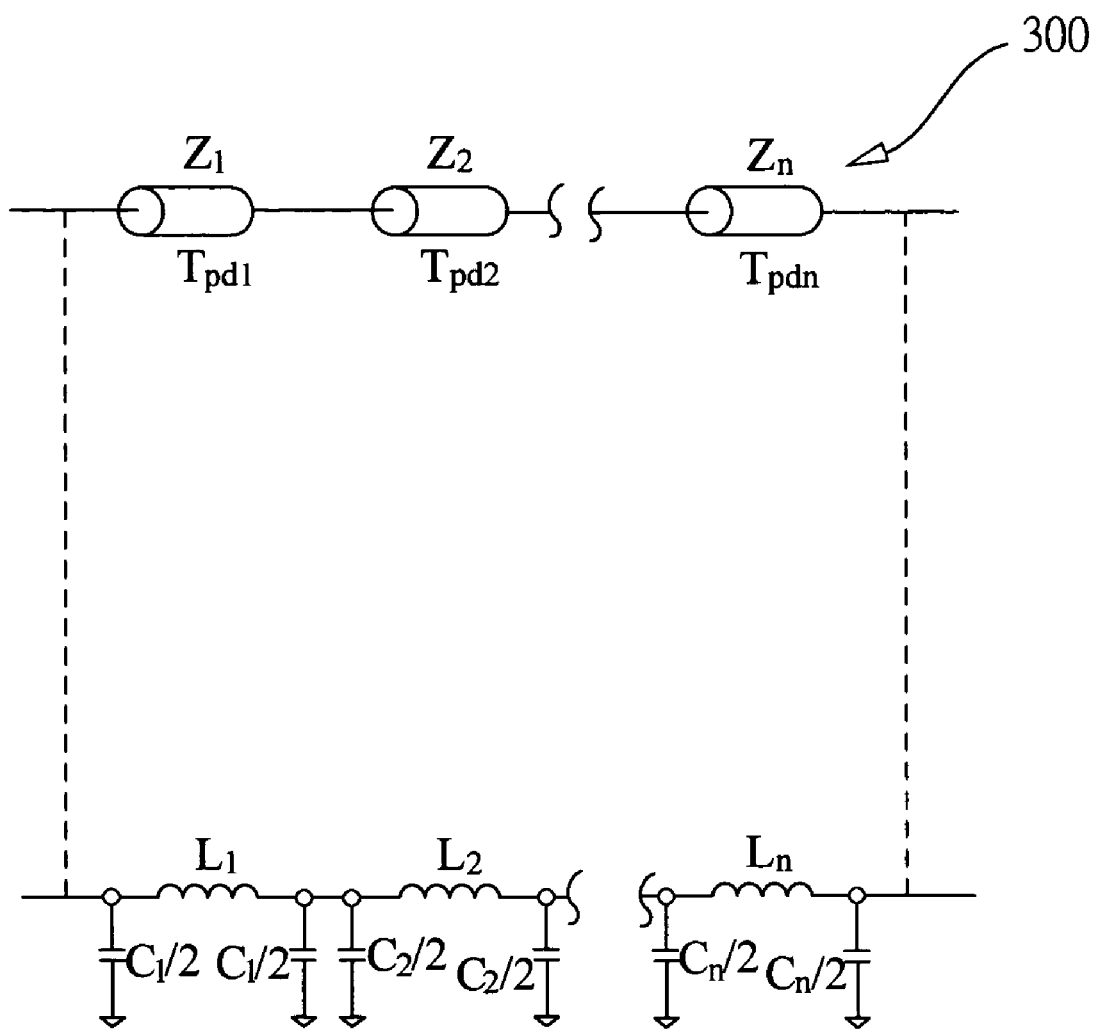
FIG. 3 shows a distributed transmission line model and a lumped element model according to the invention.

In addition, the distributed transmission line model could be translated into a lumped LC equivalent circuit model 300, as shown in FIG. 3. The inductance Ln and capacitance Cn of the nth section can be respectively calculated by $$Ln = Zn \times Tpdn \quad (3)$$

$$Cn = Yn \times Tpdn \quad (4)$$

where Yn=1/Zn.

Figure 4:
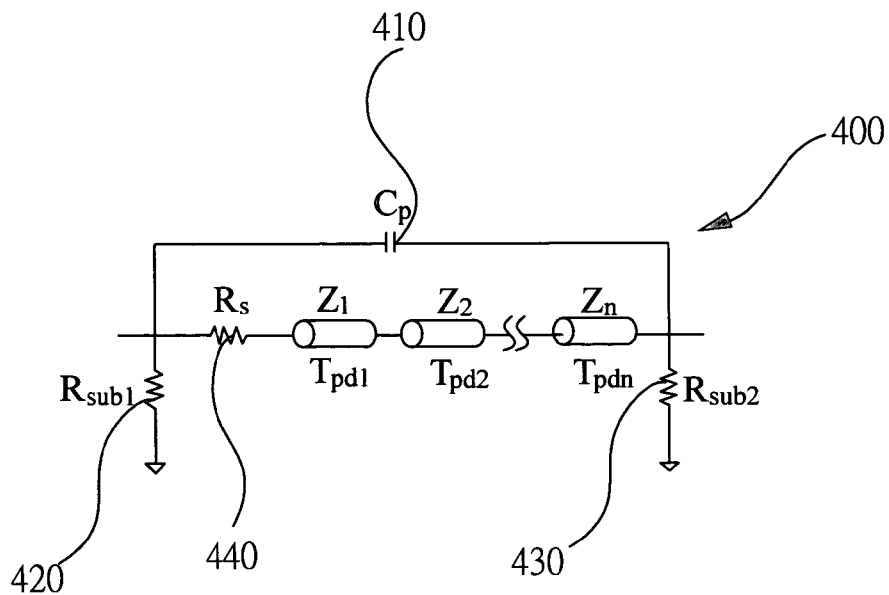
FIG. 4 is a schematic view of another embodiment of the wideband equivalent circuit model according to the invention.

However, the spiral inductor is a strongly geometry-dependent device. Therefore, some geometric effects have to be taken into account the equivalent circuit model. It is precisely on such ground that a hybrid equivalent circuit model 400 has been proposed, as shown in FIG. 4. As sketched in the figure, the Cp 410 represents the parasitic capacitance that consists of the overlap capacitance between the spiral and the underpass, and the fringing capacitance between adjacent lines. The Rsub1 420 and Rsub2 430 model the resistance associated with the substrate losses. And Rs 440 is attributed to series resistance. These model parameters can be extracted by fitting the TD responses of the equivalent circuit model to the measured ones.

Figure 5:
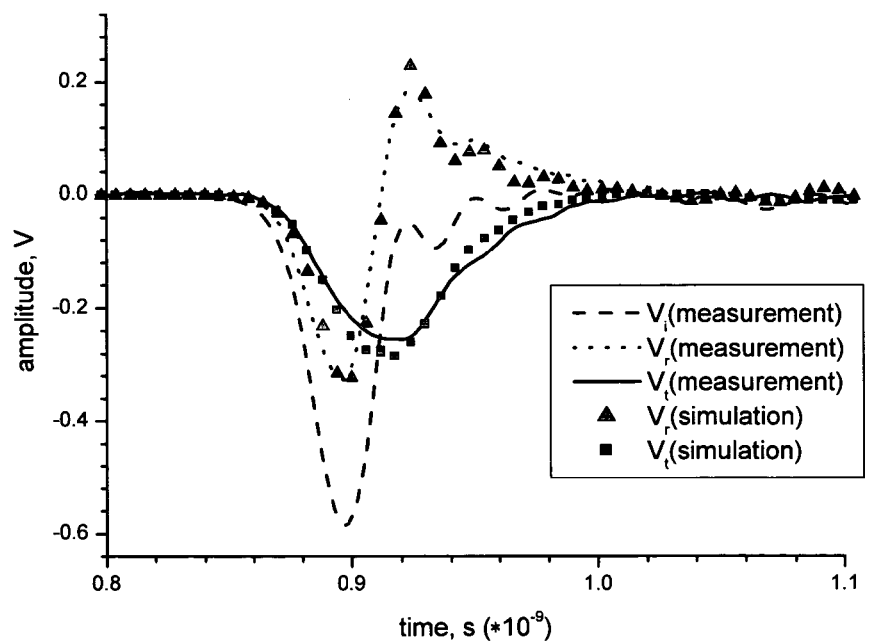
FIG. 5 shows the measurement results for a 3.5-turn spiral inductor with 17 μm line-width and the simulation results by using the corresponding wideband equivalent circuit model according to the invention.

Referring to FIG. 5, it shows the measurement results for a 3.5-turn spiral inductor with 17 μm line-width and the simulation results by using the corresponding wideband equivalent circuit model. The closeness between simulation and measurement results shows that the wideband modeling technique is feasible for characterizing the spiral inductor.

Figure 6:
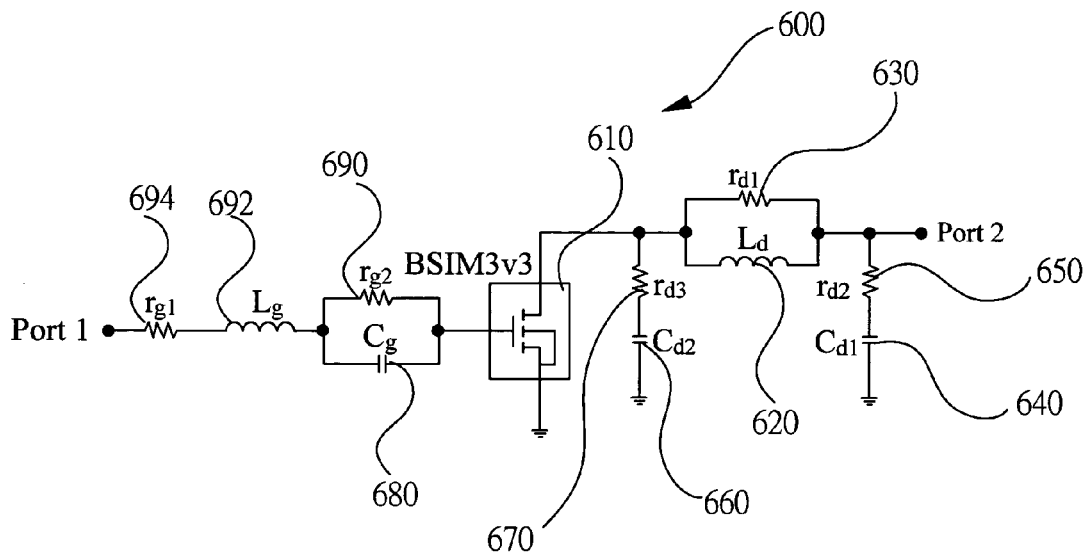
FIG. 6 is a schematic view of an embodiment of the wideband equivalent circuit model for MOSFET according to the invention.

Referring to FIG. 6, it shows an embodiment of the wideband equivalent circuit model 600 for MOSFET's according to the invention. The equivalent circuit model 600 combining commonly used BSIM3v3 610 has been proposed to meet the wideband requirement without any alteration on the DC condition of devices. The wideband equivalent circuit model 600 is comprised of only R, L and C elements at the Gate and Drain terminals. In order to preserve the DC operating point derived from the BSIM3v3 model 610 and to meet the wideband requirement, the proposed model (w-model) 600 has been constructed by a particular scheme, as shown in FIG. 6. The Ld 620 is shunted with rd1 630 for DC bypass and Drain reflection delay and shape adjustment. The Cd1 640 is in series with rd2 650 for DC block and Drain reflection amplitude and damping adjustment. Similarly, the Cd2 660 is in series with rd3 670 for DC block and Drain reflection amplitude adjustment. However, the Cd2 660 is much larger than Cd1 640 for isolating its influence on Drain reflection damping. In addition, the product of rd2 650 and Cd1 640 is smaller than that of rd3 670 and Cd2 660 due to separating the influence on Drain reflection amplitude in the initial and peak regimes. On the gate side, however, the model structure is unnecessary to take the DC consideration into account since the DC gate current is almost zero. Thus, the Cg 680 is in series with the gate terminal of BSIM3v3 610 for reducing the effective gate capacitance, and the rg2 690 is shunted to Cg 680 for DC path and Gate reflection delay adjustment. In addition, the Lg 692 is in series with rg1 694 for Gate reflection damping correction. Meanwhile, the rg2 690 and Cg 680 are in series with rg1 694 and Lg 692 for wideband consideration, since Lg 692 is almost short at low frequency and Cg 680 is short at high frequency. On the other hand, the magnitude of gate transmission is increased as rg1 694 or rg2 690 is decreased.

Figure 7:
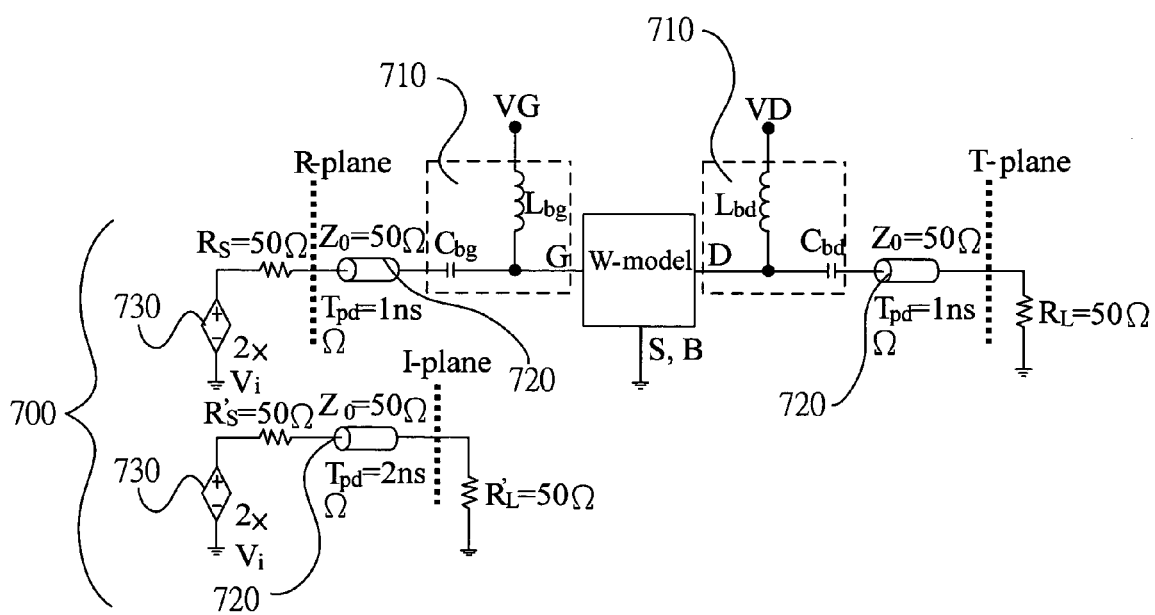
FIG. 7 is a schematic view of an embodiment of circuit architecture for model extraction according to the invention.

In order to extract the value of those extension elements from TD measurement results, the circuit architecture 700 as shown in FIG. 7 was used for HSPICE simulation. It is comprised of bias tanks 710, transmission lines 720, and voltage dependent voltage sources 730. The bias tanks 710 provide isolated DC and AC paths to the device under test. In addition, transmission lines 720 are used for observing the incident wave and its corresponding reflection and transmission responses. And the voltage dependent voltage sources 730 calibrate the practical amplitude into the device.

Figure 8A:
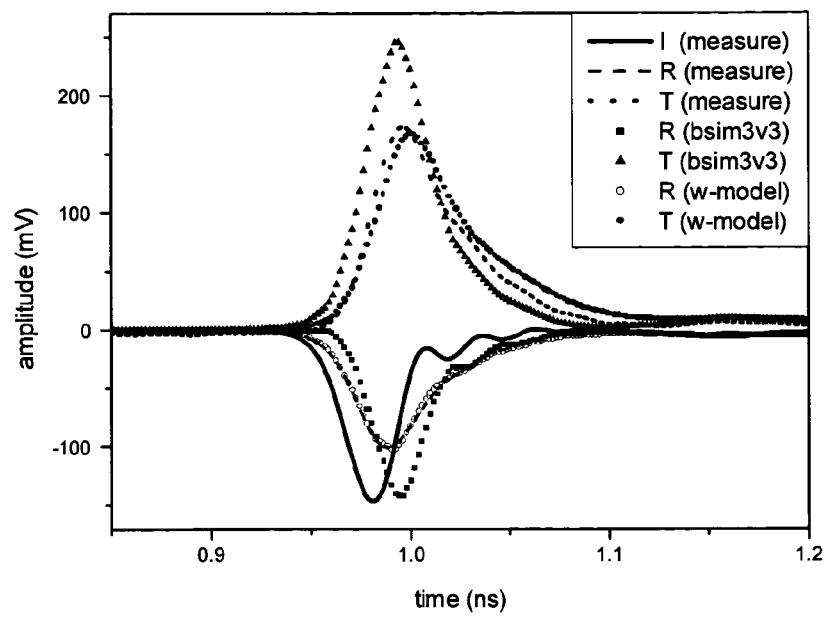
FIG. 8A shows TD responses of an NMOSFET measured from port 1 according to the invention.
Figure 8B:
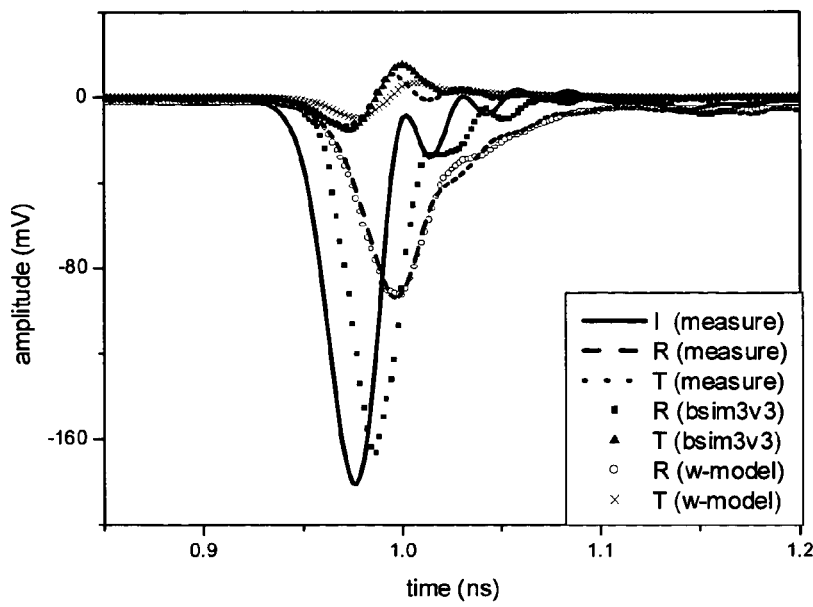
FIG. 8B shows TD responses of an NMOSFET measured from port 2 according to the invention.

FIG. 8A shows TD responses of an NMOSFET measured from port 1 according to the invention. As shown in FIG. 8, it shows measured, BSIM3v3 simulated, and w-model simulated TD responses of an NMOSFET with 0.35 μm/100 μm channel length/width biased at VG=2V and VD=2V. As the figure indicates, the measured and BSIM3v3 simulated results have obvious difference. On the other hand, the closeness between measured and w-model simulated results shows that the wideband modeling technique is feasible for characterizing the device. Similarly, FIG. 8B shows TD responses of an NMOSFET measured from port 2 according to the invention.

Based on the above experimental results, the wideband model has been verified for its suitability in describing the ultra-short TD responses of MOSFET's.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method for utilizing a Layer Peeling Technique to build a spiral inductor wideband equivalent circuit, said method comprising:
   step 1: inputting a ultra-short impulse to a inductor;
   step 2: measuring a reflective and a transmissive response of said impulse;
   step 3: building a corresponding equivalent circuit model by said reflective and transmissive responses;
   step 4: establishing and extracting impedances of a plurality of transmission lines;
   step 5: transforming said impedance of said transmission line to LC equivalent circuit model;
   step 6: combining parasitic equivalent circuit elements device and extracting parameters by comparing with said measurement;
   step 7: concluding results of the steps depicted above.

2. The method according to claim 1, wherein said step 4 is simplified to merely comprise a signal path of a first reflection and a first transmission.

3. The method according to claim 1, wherein said LC equivalent circuit model is composed of n pieces of inductor Ln and capacitor Cn; $Ln = Zn \times Tpdn$ $Cn = Yn^x \, Tpdn$, wherein $Yn = 1/Zn$, Tpdn is transmission time of the nth transmission line.

* * * * *